(12) United States Patent  
Liu et al.

(10) Patent No.: US 7,978,479 B2
(45) Date of Patent: Jul. 12, 2011

(54) WLAN SIP MODULE

(75) Inventors: I-Ru Liu, Taipei (TW); Ting-Yi Tsai, Taipei (TW); Wen-Bing Luo, Taipei (TW)

(73) Assignee: Accton Technology Corporation, Hsinchu (TW)

( * ) Notice: Subject to any disclaimer, the term of this patent is extended or adjusted under 35 U.S.C. 154(b) by 1000 days.

(21) Appl. No.: 11/889,601

(22) Filed: Aug. 15, 2007

(65) Prior Publication Data

US 2009/0046439 A1 Feb. 19, 2009

(51) Int. Cl.
*H01R 9/00* (2006.01)

(52) U.S. Cl. .......................... 361/772; 361/773; 361/775

(58) Field of Classification Search .......... 361/772–775; 257/686–692, 728–732

See application file for complete search history.

(56) References Cited

U.S. PATENT DOCUMENTS

| | | | | |
|---|---|---|---|---|
| 6,734,539 | B2 * | 5/2004 | Degani et al. | 257/686 |
| 7,061,122 | B2 * | 6/2006 | Kim et al. | 257/778 |
| 7,180,165 | B2 * | 2/2007 | Ellsberry et al. | 257/686 |

* cited by examiner

*Primary Examiner* — Tuan T Dinh

(74) *Attorney, Agent, or Firm* — WPAT, PC; Justin King

(57) ABSTRACT

The present invention provides a SiP module for wireless local area network comprising a base. A control unit is formed on a first surface of the base and a RF front end components is formed on a second surface of the base and coupled to the control unit through the base. A plurality of group of bumps is arranged on the first surface and coupled to the control unit, and separated with one another to reduce the interference.

12 Claims, 3 Drawing Sheets and converting the IF band signal of WLAN. RF front end components formed on a second surface of the base and coupled to the control unit through the base; and a plurality of group of bumps arranged on the first surface and coupled to the control unit, and separated with one another to reduce the interference thereamong. The material of the base includes silicon, glass, quartz, PCB or ceramic. The plurality of group of bumps includes a first group for High frequency analog (RF) signal transmission, a second group for Digital data bus transmission and a third group for digital control signal. At least one band pass filter is formed on the second surface and coupled between the control unit and the RF front end components. A memory is formed on the second surface and coupled to the control unit. An oscillator is formed on the second surface and coupled to the control unit.

WLAN SIP MODULE

BACKGROUND OF THE INVENTION

1. Field of the Invention

This invention relates to a wireless local area network (WLAN) module, and more particularly to a SIP module for wireless local area network.

2. Description of the Prior Art

In conventional semiconductor device fabrication processes, a number of distinct semiconductor devices, such as memory chips or microprocessors, are fabricated on a semiconductor substrate, such as a silicon wafer. After the desired structures, circuitry, and other features of each of the semiconductor devices have been fabricated upon the semiconductor substrate, the substrate is typically singulated to separate the individual semiconductor devices from one another. Various post-fabricating processes may be employed either prior to or following singulation of the semiconductor chips. These post-fabricating processes may be employed to impart the semiconductor devices with their intended functionality and to determine whether or not each of the individual semiconductor devices meets quality control specifications.

The individual semiconductor devices may then be packaged. Along with the trend in the semiconductor industry to decrease semiconductor device size and increase the density of structures of semiconductor devices, package sizes are also ever-decreasing. Presently, any type package technique of IC device is adopted firstly sawing the die on wafer to be individual die, and then packaging and testing of the sawed dies. Such package technique of sawing prior to packaging and testing causes a tedious and complicated process and increasing cost of packaging and testing of the IC device, owing to continuously repeating packaging and testing of the sawed die.

Demands for more compact, thinner and lighter portable electronic devices, such as digital cellular phones, and notebook computers, the only solution is to become smaller and stronger. To respond thereto, amazing reduction has been realized in recent ULSI, and developments have been made to improve packaging density of components on a mounting board.

Furthermore, development has been advanced to a complicated type of package called a system-in-package (SiP) wherein a passive element, such as a coil, and other semiconductor chips are buried in an interlayer of an insulating layer for insulating rewiring layers formed on a semiconductor substrate (chip) and packaged at a wafer level. The SIP allows providing a large number of a semiconductor device and large capacity passive elements such as decoupling capacitors to be formed on a substrate. It is also desirable to provide a semiconductor and a method of fabricating the semiconductor capable of satisfying needs for improved high-frequency characteristics and miniaturized multi-chip modules, by mounting a plurality of IC chips and passive elements on a substrate, and by mutually connecting the chips by wiring.

Therefore, the present invention provides a novel SIP module for WLAN.

SUMMARY

The main objective of the present invention is to provide SIP module for WLAN to eliminate the signal interference and improve the thermal dispassion. Also improve manufacturing yield rate.

The present invention provides a SIP module for wireless local area network comprising a base; a control unit formed on a first surface of the base; RF front end components formed on a second surface of the base and coupled to the control unit through the base; and a plurality of group of bumps arranged on the first surface and coupled to the control unit, and separated with one another to reduce the interference thereamong. The material of the base includes silicon, glass, quartz, PCB or ceramic. The plurality of group of bumps includes a first group for High frequency analog (RF) signal transmission, a second group for Digital data bus transmission and a third group for digital control signal. At least one band pass filter is formed on the second surface and coupled between the control unit and the RF front end components. A memory is formed on the second surface and coupled to the control unit. An oscillator is formed on the second surface and coupled to the control unit.

Another aspect of the present invention provides a SiP module, comprising: a base; a first chip formed on a first surface of the base; a second chip formed on a second surface of the base and coupled to the first chip through the base; and at least a first and a second groups of bumps arranged on the first surface and coupled to the first chip, wherein the first group of bumps is separated from the second group of bump with each other to reduce the interference there-between.

DESCRIPTION OF THE PRESENT INVENTION

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1:
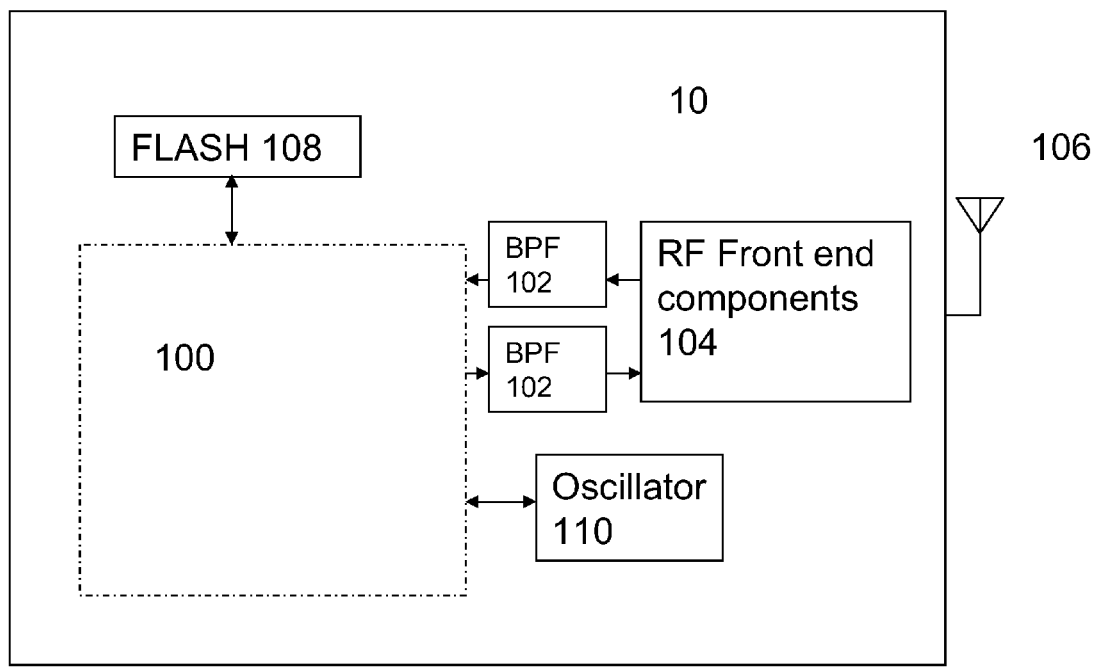
FIG. 1 is a schematic diagram of top view of the present invention.

The present invention includes a 2.4 GHz radio, analog-to-digital and digital-to-analog converters, a base-band processor, multi-protocol media access control (MAC), CPU, RF front end Module (FEM) components, Band Pass Filter. It enables a high performance, cost effective, low power, compact solution for digital camera, cellular/WLAN handset, PDA, VoIP handset, or MP3/4 player. Some major devices will be illustrated as follows. The SiP module supports all IEEE 802.11b/g data rates and wireless MAC protocol as well as 802.11i security. However, only the major parts are shown in FIG. 1, referring to FIG. 1, it is a schematic diagram of the present invention which is a highly integrated solution for combined cellular/handset applications. A control unit 100 is provided in the SiP (system in package) module for controlling the data access and signal process. It should be noted that the control unit 100 is formed at the surface opposite to the surface for carrying following device. Band pass filters (BPF) 102 are coupled between the control unit 100 and the RF front end components 104. The BPF 102 is used to filtering out undesired frequency for transmitter and receiver, respectively. The RF front end components is typically employed to process the transmitting and receiving signal, and is coupled to an antenna 106. Please refer to FIG. 1-3, the devices mentioned above are formed under a substrate 10 and constructed as so call flip-chip configuration. A memory 108 such as flash and an Oscillator 110 are coupled to the control unit 100.

Figure 2:
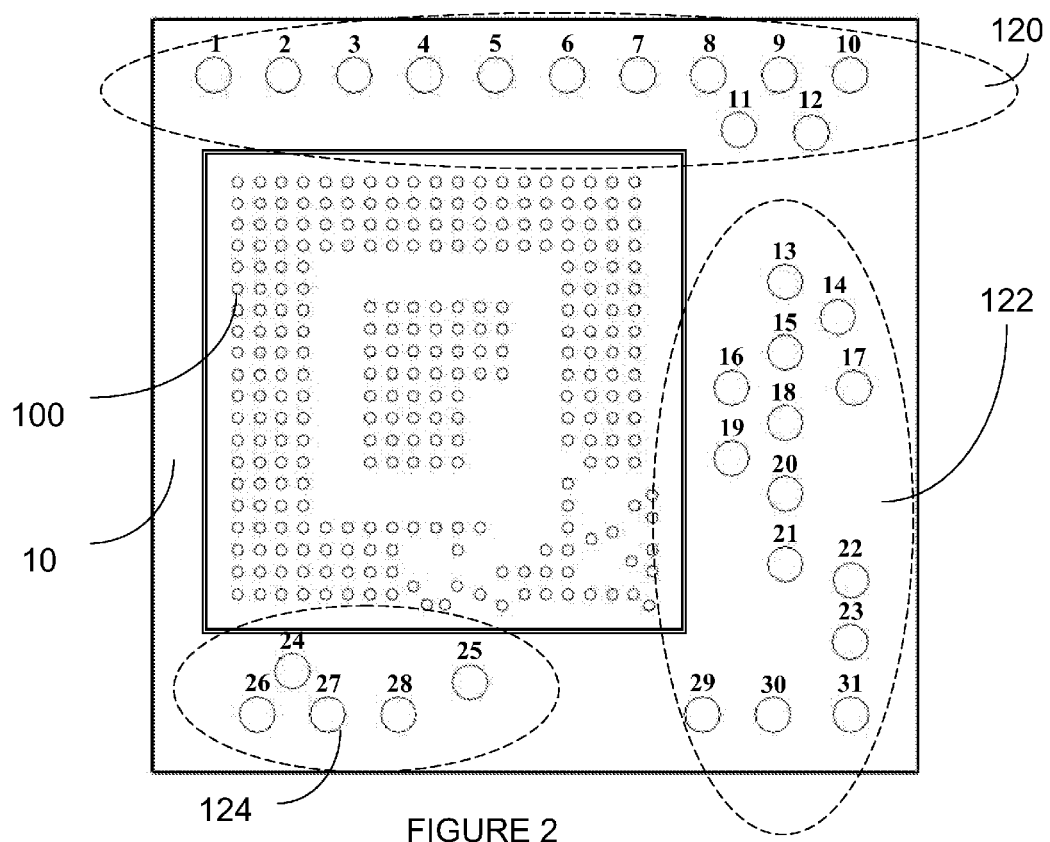
FIG. 2 is a schematic diagram of bottom view of the present invention.

As shown in FIG. 1, an adhesive material (not shown) is coated on a base (or substrate) 10. In one embodiment, the adhesive material is formed on surface of the base 10 by spin coating or printing. The material of the base 10 is plastic, silicon, glass, quartz, ceramic, PCB etc. Referring to FIG. 2, it is a schematic diagram showing a plurality of bumps surrounding the control unit 100. The bumps could be formed by solder technology or so-called ball grid array technology. As known, solder paste is formed within a soldering mask, followed by re-flowing the solder paste, thereby transferring the solder into a ball shape. For example, the solder is pre-heated at around 60-120 seconds. The heating is performed around 30-50 seconds. The peak temperature is about 230-260 centigrade degrees. The temperature rising and falling slope is around 10 degree per second. It should be noted that the bumps are classified into at least three groups and located at separated areas of the lower surface of the substrate 10. The upper surface of the substrate includes passive devices and other semiconductor components mentioned above. In order to avoid interference, the aforementioned devices are located at the opposite surface to the surface for carrying the control unit 100 and the bumps. The first group of the bumps 120 located at the upper edge of the substrate 10 for digital data bus signal transferring. A second group of bumps 122 are employed for High frequency Analog signal (RF) and located at the right side of the control unit 100 to isolate the bumps from the digital data bus signal transferring bumps. Similarly, the third group of the bumps 124 is utilized for digital control signals. The bumps 124 are arranged at the lower of the substrate 10. It should be noted that the lower, upper and right side could be alternative depending on the demand. For example, the bumps 122 could be changed to left side while the bumps 120, 24 are altered with each other. Under such arrangement, the High speed digital, low speed control signal can be completely isolate with High frequency analog (RF) signal. Also, the EM interference will be eliminated. The signal transmission will not be interrupted by the high or low power transmission.

The control unit 100 is coupled to the flash 108, BPF 102 and other components via through holes or via holes formed within the substrate 10. The substrate 10 could be single layer or multi-layer substrate. As known, wires may be formed within or on the substrate. The pitch, solder ball size and ball pattern for the BGA footprint of SiP module can be changed depending on necessary.

Figure 3:
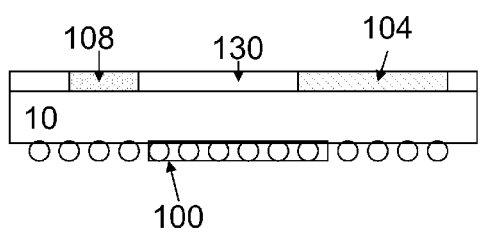
FIG. 3 is a schematic diagram of cross sectional view of the present invention.
Figure 4:
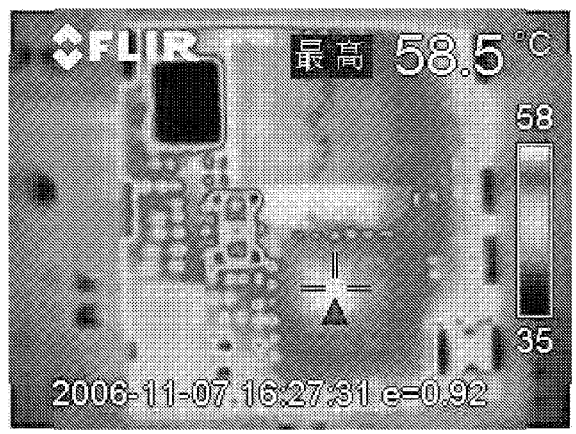
FIG. 4 is a thermal distribution analysis of the present invention.

Referring to FIG. 3, an encapsulated layer 130 is optional formed over the surface of the substrate 10 for protection. Another benefit for the SiP module is that the thermal dissipation will be improved due to some devices are located at the upper surface and maybe exposure to the air directly. The thermal analysis may refer to FIG. 4, it shows better thermal distribution and the highest temperature is lower than 58.5 centigrade degrees. From the cross sectional view, most all of the devise such as controlling unit 100, RF front end components 104 or the flash 108 and so on are exposed to the air. The area for thermal dissipation is significantly increased, therefore, the present invention offers better thermal solution for the SiP module. Furthermore, the signal interference between the controlling unit and other devices are reduced than ever. BY using the isolation scheme, the signal transmission will not be interference by the power line as well. Consequently, the performance of the WLAN SiP module is better than conventional design.

Although specific embodiments have been illustrated and described, it will be obvious to those skilled in the art that various modifications may be made without departing from what is intended to be limited solely by the appended claims.

What is claimed is:

1. A SiP module for wireless local area network, comprising:
   a base;
   a control unit formed on a first surface of said base;
   at least one RF front end component formed on a second surface of said base and coupled to said control unit through said base; and
   a plurality of group of bumps arranged on said first surface, and some groups are coupled to said control unit, and other groups are arranged around the control unit, and each group is separated with one another;
   wherein said plurality of group of bumps includes a first group for transferring digital data bus signal;
   wherein said plurality of group of bumps includes a second group for High frequency Analog signal (RF);
   wherein said plurality of group of bumps includes a third group for digital control signals; and
   further comprising an encapsulated layer coated over said second surface.

2. The SiP module in claim 1, wherein material of said base includes silicon, glass, quartz, PCB or ceramic.

3. The SiP module in claim 1, further comprising a band pass filter formed on said second surface and coupled between said control unit and said RF front end components.

4. The SiP module in claim 1, further comprising a memory formed on said second surface and coupled to said control unit.

5. The SiP module in claim 1, further comprising an oscillator formed on said second surface and coupled to said control unit.

6. A SiP module, comprising:
   a base;
   a first chip formed on a first surface of said base;
   a second chip formed on a second surface of said base and coupled to said first chip through said base; and
   at least a first and a second groups of bumps arranged on said first surface, and the first group of bumps is coupled to said first chip, wherein said first group of bumps is separated from said second group of bump with each other;
   wherein said first group of bumps includes digital data bus signal transferring bump configured to transfer digital data bus signal;
   wherein said second group of bumps includes High frequency Analog signal (RF) bump;
   further comprising a third group of bumps arranged on said first surface and coupled to a third chip, wherein said third group of bumps is separated from said first and second groups of bump with each other, and includes digital control signals bumps; and
   further comprising an encapsulated layer coated over said second surface.

7. The SiP module in claim 6, wherein material of said base includes silicon, glass, quartz, PCB or ceramic.

8. The SiP module in claim 6, further comprising a band pass filter formed on said second surface and coupled between said first chip and said second chip.

9. The SiP module in claim 6, further comprising a memory formed on said second surface and coupled to said first chip.

10. The SiP module in claim 6, further comprising an oscillator formed on said second surface and coupled to said first chip.

11. The SiP module in claim 6, wherein said first chip includes a control chip.

12. The SiP module in claim 6, wherein said second chip includes a RF front end chip.

* * * * *